United States Patent
Hirota et al.

(10) Patent No.: US 9,859,309 B2
(45) Date of Patent: Jan. 2, 2018

(54) DISPLAY DEVICE

(71) Applicant: Japan Display Inc., Tokyo (JP)

(72) Inventors: Takenori Hirota, Tokyo (JP); Hidekazu Miyake, Tokyo (JP); Toshinari Sasaki, Tokyo (JP); Shinichiro Oka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/241,443

(22) Filed: Aug. 19, 2016

(65) Prior Publication Data

US 2017/0053953 A1 Feb. 23, 2017

(30) Foreign Application Priority Data

Aug. 21, 2015 (JP) .................. 2015-163637

(51) Int. Cl.
*H01L 27/12* (2006.01)
*G02F 1/1368* (2006.01)
*G02F 1/1362* (2006.01)
*H01L 29/786* (2006.01)

(52) U.S. Cl.
CPC ........ *H01L 27/1262* (2013.01); *G02F 1/1368* (2013.01); *G02F 1/136227* (2013.01); *H01L 27/1218* (2013.01); *H01L 27/1225* (2013.01); *G02F 2201/54* (2013.01); *H01L 29/7869* (2013.01)

(58) Field of Classification Search
CPC .................................... H01L 27/1262
USPC .......................... 257/258; 438/457
See application file for complete search history.

(56) References Cited

U.S. PATENT DOCUMENTS

| 6,849,877 B2 * | 2/2005 | Yamazaki | H01L 27/3244 257/290 |
|---|---|---|---|
| 8,168,537 B2 * | 5/2012 | Jasper | H01L 24/13 257/687 |
| 2015/0069382 A1 * | 3/2015 | Ahn | H01L 29/7869 257/43 |

FOREIGN PATENT DOCUMENTS

| JP | 2008-058489 A | 3/2008 |
|---|---|---|
| JP | 2009-294602 A | 12/2009 |
| JP | 2012-246540 A | 12/2012 |

* cited by examiner

*Primary Examiner* — Chandra Chaudhari
(74) *Attorney, Agent, or Firm* — Typha IP LLC

(57) ABSTRACT

A display device in an embodiment according to the present invention includes a first substrate, a second substrate opposing the first substrate, and a transistor provided in the first substrate, a scanning signal line, a video signal line, and a pixel electrode that are electrically connected to the transistor, and a first insulating layer. The thickness of the first substrate is 0.3 mm or less, the first insulating layer contacts the first substrate, and is provided between the first substrate and the transistor, and the first insulating layer includes an organic insulating layer.

9 Claims, 11 Drawing Sheets

DISPLAY DEVICE

CROSS REFERENCE TO RELATED APPLICATIONS

This application is based upon and claims the benefit of priority from the prior Japanese Patent Application No. 2015-163637, filed on Aug. 21, 2015, the entire contents of which are incorporated herein by reference.

FIELD

An embodiment of the present invention relates to a technique for thinning a display device.

BACKGROUND

In a portable electronic device called a smartphone or a tablet terminal, a display device, which forms a display screen, is a principal member as a member that occupies one surface of its main body. The main body of the portable electronic device has been requested to be thinned from an aesthetic viewpoint presented by its appearance. To satisfy such a request, the display device itself needs to be thinned.

A liquid crystal display known as one of display devices has a configuration in which a liquid crystal layer is provided between an element substrate provided with a pixel array using a transistor and an opposite substrate provided with a color filter. As one of means for thinning the display device, the element substrate using glass or the like also used for the opposite substrate has been thinned by mechanical polishing or chemical polishing. For example, Japanese Patent Application Laid-Open No. 2009-294602 discloses a manufacturing method for sticking an opposite substrate cured by applying resin to a support substrate and an element substrate using a material such as glass together and thinning the element substrate by etching when the opposite substrate is removed from the support substrate.

SUMMARY

A display device in an embodiment according to the present invention includes a first substrate, a second substrate opposing the first substrate, and a transistor provided on the first substrate, a scanning signal line, a video signal line, a pixel electrode electrically connected to the transistor, and a first insulating layer. The thickness of the first substrate is 0.3 mm or less, the first insulating layer is provided between the first substrate and the transistor, and the first insulating layer includes an organic insulating layer.

A display device in an embodiment according to the present invention includes a first substrate, a second substrate opposing the first substrate, a transistor provided on the first substrate, a scanning signal line, a video signal line, a pixel electrode electrically connected to the transistor, and a first insulating layer, and a second insulating layer provided on the second substrate, and a color filter layer and/or a light shielding layer. The thickness of the second substrate is 0.3 mm or less, the second insulating layer contacts the second substrate, and is provided between the second substrate and the color filter layer or the light shielding layer, and the second insulating layer includes an organic insulating layer.

DESCRIPTION OF EMBODIMENTS

Figure 1:
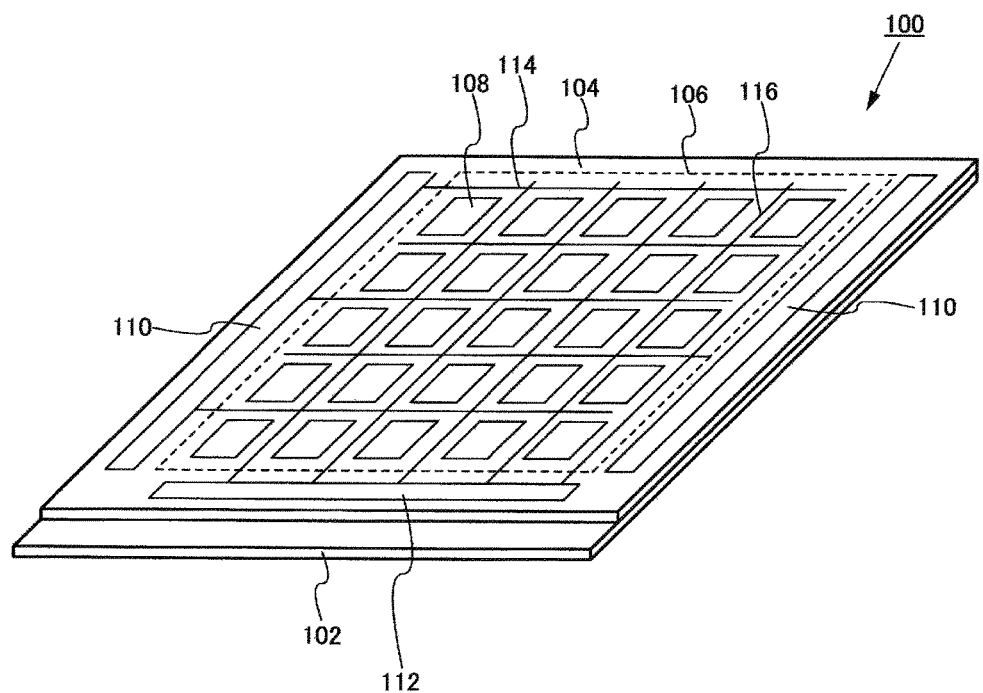
FIG. 1 is a perspective view illustrating a configuration of a display device according to an embodiment of the present invention.

Embodiments of the present invention will hereinafter be described with reference to the drawings. The present invention can be implemented according to many different embodiments, and is not intended to be interpreted by being limited to description contents of the embodiments illustrated below. While the width, the thickness, the shape, and the like of each of portions may be more schematically represented than those in an actual form to make the description clearer, this is only one example, and is not intended to limit the interpretation of the present invention. In the present specification and the drawings appended thereto, similar elements to those described above with reference to the already illustrated drawing may be assigned the same reference signs or similar reference signs (reference signs having a, b, etc. added after numbers) to omit detailed description, as needed. Further, characters having "first", "second", etc. added to elements are used for reference only to distinguish the elements, and do not means more than that unless otherwise particularly described.

In the present specification, when a member or region exists "on (or under)" another member or region, this includes not only a case where the member or region exists just above (or just below) the other member or region but also a case where the member or region exists above (or below) the other member or region, i.e., includes a case where another constituent element is included between the member or region above (below) the other member or region and the other member or region.

An element substrate used as a base material for a display device can be thinned by mechanical polishing and chemical etching. However, when the thickness of the element substrate becomes significantly small (e.g., 0.3 mm or less), the element substrate is easily damaged, and is difficult to handle during manufacture. The substrate is required to be further thinned, and there is an increasing need to reduce the thickness of the substrate to 0.15 mm or less.

However, the element substrate is significantly easily damaged when it has such a thickness, and requires a considerable attention for handling.

According to a method for manufacturing a display device disclosed in Japanese Patent Application Laid-Open No. 2009-294602, a glass substrate used as an element substrate can be thinned. However, any measures to prevent the damage have not been implemented. The glass substrate can be curved as it is thinned. However, in the display device disclosed in Japanese Patent Application Laid-Open No. 2009-294602, an internal stress of a thin film laminated on the glass substrate has not been considered. Further, an opposite substrate is made of resin. Therefore, a problem may occur in the reliability of the display device under the effect of water or the like.

An embodiment of the present invention, described below, discloses a display device that can maintain a balance between thinning and strength securement and/or perform stress control when it is thinned.

Outline of Display Device

FIG. 1 illustrates the outline of a display device 100 according to an embodiment of the present invention. The display device 100 has a configuration in which respective one main surfaces of a first substrate 102 and a second substrate 104 are arranged opposite to each other and are fastened to each other. A region where the first substrate 102 and the second substrate 104 are arranged opposite to each other is provided with a pixel region 106 where a plurality of pixels 108 are arranged. The pixel region 106 forms a display screen in the display device 100. A first driving circuit 110 that outputs a scanning signal to the pixels 108 and a second driving circuit 112 that outputs a video signal to the pixels 108 are provided adjacent to the pixel region 106. A scanning signal line 114 is connected to the first driving circuit 110, and a video signal line 116 is connected to the second driving circuit 112. The scanning signal line 114 feeds a scanning signal to the pixels 108, and the video signal line 116 feeds a video signal to the pixels 108.

In the display device 100 illustrated in FIG. 1, the first substrate 102 is an element substrate including an element such as a transistor and pixel electrodes respectively individually provided in pixels. The second substrate 104 is an opposite substrate having a color filter, a light shielding film, or the like formed therein.

The display device 100 illustrated in FIG. 1 is a display device in which a liquid crystal layer is sandwiched between the first substrate 102 and the second substrate 104. The first substrate 102 and the second substrate 104 are arranged opposite to each other with a gap interposed therebetween, and are fastened to each other with a seal material (not illustrated). In the display device 100, the gap between the first substrate 102 and the second substrate 104 is filled with a liquid crystal, and an image is displayed using an electro-optical effect of the liquid crystal. In FIG. 1, a retardation plate and a polarizing plate, which are provided in the display device 100 using the liquid crystal, are omitted.

A glass substrate is used as the first substrate 102 and the second substrate 104. When the glass substrate is thinned, the display device 100 can be made thin and lightweight. The display device 100 according to the one embodiment of the present invention has a layer for reinforcing the strength of the glass substrate provided in its inner part to ensure a practical strength even when one or both of the first substrate 102 and the second substrate 104 is/are thinned. This layer can also be used as a layer for controlling a bending stress applied to the glass substrate. In embodiments, described below, various types of forms in the display device according to the present invention will be illustrated.

In the following description, the side on which the second substrate 104 is arranged with respect to the first substrate 102 is "on" or "above", and the side on which the first substrate 102 is arranged with respect to the second substrate 104 is "under" or "below" in a cross-sectional view unless otherwise noted.

First Embodiment

In the present embodiment, a display device in which a substrate is provided with a reinforcing material is illustrated.

1-1. Configuration on the Side of First Substrate

Figure 2:
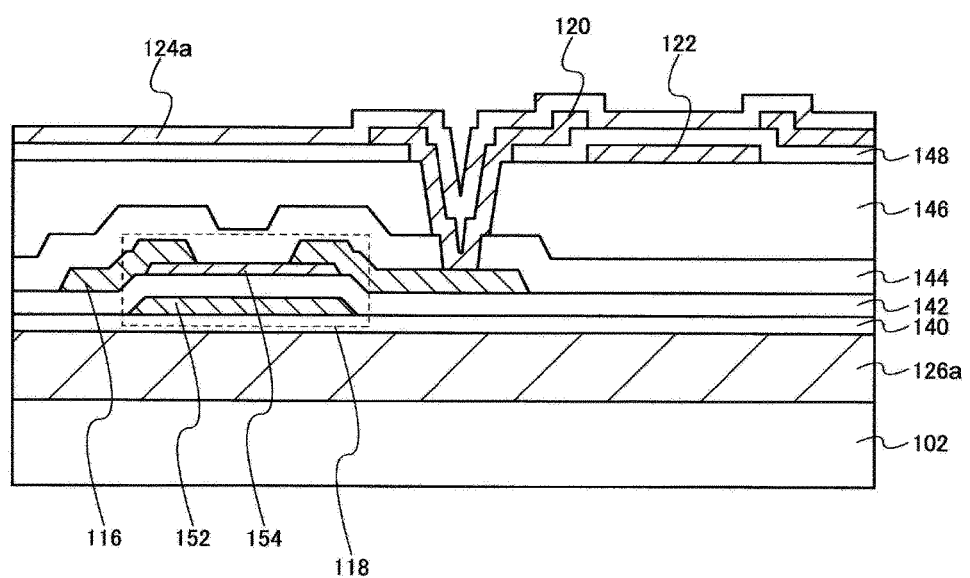
FIG. 2 is a cross-sectional view illustrating a configuration of the display device according to the embodiment of the present invention.

FIG. 2 is a cross-sectional view illustrating a configuration, on the side of the first substrate 102, of the display device according to the present embodiment. The first substrate 102 is a thin plate. The thickness of the first substrate 102 is 0.7 mm or less, for example, preferably 0.3 mm or less, and more preferably 0.15 mm or less. As a specific example, the first substrate 102 has a thickness of 0.1 mm, for example. When the thickness of the first substrate 102 is in such a range, the display device is thinned. Examples of a material for the first substrate include an organic material such as resin and an inorganic material such as an inorganic oxide. The material for the first substrate is preferably an inorganic material. The inorganic material is preferably an inorganic oxide such as glass or sapphire, and more preferably glass.

The first substrate 102 has a transistor 118 and members constituting the pixels, e.g. a pixel electrode 120 for driving a liquid crystal and a common electrode 122 provided on its first surface. A first insulating layer 126a is provided between the transistor 118 and the first substrate 102. A third insulating layer 140 is further provided between the transistor 118 and the first insulating layer 126a. The first insulating layer 126a includes an organic insulating layer. When the first insulating layer 126a includes the organic insulating layer, the third insulating layer 140 provided as a base film of the transistor 118 is preferably an inorganic insulating layer. When the inorganic insulating layer is provided as the third insulating layer 140, the third insulating layer 140 can be made to function as a barrier layer.

The transistor 118 has a configuration in which a gate electrode 152, a fourth insulating layer 142 serving as a gate insulating layer, and a semiconductor layer 154 are laminated. One of a source region and a drain region of the transistor 118 is electrically connected to the pixel electrode 120, and the other region is connected to a video signal line 116 described with reference to FIG. 1. The gate electrode 152 is electrically connected to the scanning signal line 114 described with reference to FIG. 1. Thus, the first insulating layer 126a is provided on the side below the scanning signal line and the video signal line 116. That is, the first insulating layer 126a is provided on the side closer to the first substrate 102.

An interlayer dielectric layer is provided between the transistor 118 and the pixel electrode 120. FIG. 2 illustrates a form in which a fifth insulating layer 144 and a sixth insulating layer 146 are provided as the interlayer dielectric layer. The fifth insulating layer 144 is an inorganic insulating layer also serving as a passivation, and the sixth insulating layer 146 is an organic insulating layer used as a flattening film.

A material used for the first substrate 102 is a material having low toughness and ductility and exposes brittleness when thinned. Particularly, this phenomenon is significant in an inorganic oxide such as glass. On the other hand, an organic insulating layer is preferably used as the first insulating layer 126a. The organic insulating layer has the property that brittle fracture does not easily occur and is superior in shock resistance to the material used for the first substrate 102. In the present embodiment, the first insulating layer 126a including the organic insulating layer is used as a reinforcing material for the first substrate 102. When the first insulating layer 126a is provided, even if the first substrate 102 is thinned, the strength thereof can be ensured. The first substrate 102 and the first insulating layer 126a are preferably provided in close contact with each other. Thus, the first insulating layer 126a reliably absorbs a shock applied to the first substrate 102 so that the first substrate 102 can be prevented from being damaged.

Another organic insulating layer may be formed on the opposite side to the side, on which the first insulating layer 126a is formed, of the first substrate 102. Example of such an organic insulating layer include an adhesive for making a polarizing plate and the first substrate 102 adhere to each other. The first substrate 102 can be more prevented from being damaged by further including the organic insulating layer.

The organic insulating layer used as the first insulating layer 126a preferably has a value that is as close to the coefficient of thermal expansion of the first substrate 102 as possible. When the respective coefficients of thermal expansion of the first insulating layer 126a and the first substrate 102 are close to each other, the first layer 130a can be inhibited from being peel off from the first substrate 102, and the first substrate 102 can be inhibited from warping due to a thermal stress.

An organic insulating material that can be used as the first insulating layer 126a is preferably polyimide. The coefficient of thermal expansion of polyimide has a value relatively close to the coefficient of thermal expansion of glass serving as a typical example of the first substrate 102 among organic insulating materials. Polyimide is appropriate as the reinforcing material for the first substrate 102 because it is superior in heat resistance and chemical resistance and has a high coefficient of elasticity. Further, polyimide is also applicable to a case where the first substrate 102 is curved to form a display device having a curved surface shape because it is flexible. The organic insulating layer, which can be used as the first insulating layer 126a, is not limited to polyimide. Another organic resin material can be used if it is superior in adhesiveness to the material for the first substrate 102 and has a coefficient of thermal expansion close to that of a glass substrate.

The thickness of the first insulating layer 126a is not limited. When polyimide is used as the first insulating layer 126a, the effect of retardation due to birefringence cannot be ignored if the thickness of the first insulating layer 126a increases, and a function as the reinforcing material for the first substrate 102 decreases if the thickness of the first insulating layer 126a is too small. Thus, the first insulating layer 126a preferably has a thickness of approximately 0.2 μm to 20 μm, for example.

The first insulating layer 126a is produced by salivating or applying a precursor solution containing a precursor and a solvent on a first surface of the first substrate 102 and heating the precursor solution. When polyimide is used as the first insulating layer 126a, a polyimide layer is produced by salivating or applying a polyimide precursor solution containing a polyamic acid and a solvent to the first surface of the first substrate 102 and heating the polyimide precursor solution, for example. When such an application and baking process is used, the first insulating layer 126a can be provided in close contact with the first substrate 102.

An inorganic insulating layer is used as the fifth insulating layer 144 serving as the interlayer dielectric layer. A silicon oxide film or a silicon nitride film or a laminate of the silicon oxide film and the silicon nitride film is applicable, for example, as the inorganic insulating layer. The sixth insulating layer 146 is formed using an organic resin material to be used as a flattening film.

FIG. 2 illustrates a pixel structure of a transverse electric field system, in which the pixel electric 120 and the common electrode 122 are provided with a seventh insulating layer 148 interposed therebetween. An orientation film 124 for orienting a liquid crystal is provided to cover the pixel electrode 120 and the seventh insulating layer 148. The orientation film 124a is formed of an organic material such as polyimide.

According to the configuration on the side of the first substrate 102 illustrated in FIG. 2, when the first insulating layer 126a is provided in contact with the first substrate 102, even if the first substrate 102 is thinned, the strength thereof can be ensured.

Figure 3:
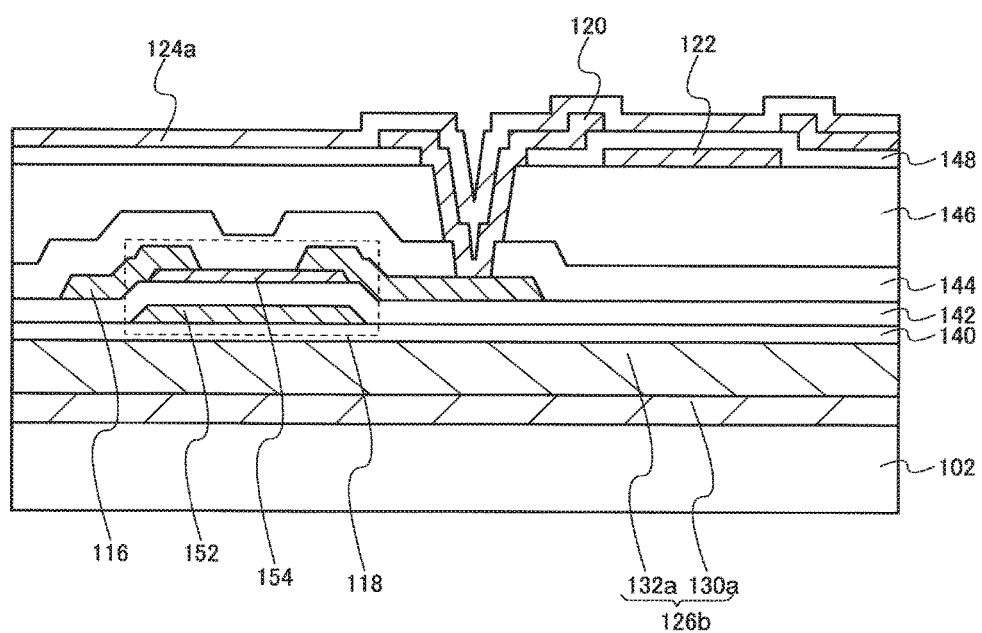
FIG. 3 is a cross-sectional view illustrating a configuration of the display device according to the embodiment of the present invention.

FIG. 3 illustrates a form in which a first insulating layer includes a plurality of layers. The first insulating layer 126b has a configuration in which a first layer 130a and a second layer 132a are laminated. The first layer 130a in the first insulating layer 126b is provided to contact the first substrate 102. The first layer 130a is the same as that in the first insulating layer 126a described with reference to FIG. 2, and polyimide is appropriately used as a material for an organic insulating layer.

A second organic insulating layer different from the organic insulating layer used in the first layer 130a is applied as the second layer 132a. An organic insulating layer composed of polyimide, acrylic, polyamide (preferably aramid), or polyethersulfone, for example, is used as the second layer 132a. Of course, the second layer 132a is not limited to this. Another organic material can also be used if it has heat resistance capable of withstanding a process for manufacturing the transistor 118.

When a plurality of layers, which differ in material, are thus laminated as the first insulating layer 126b, the film thickness of the first insulating layer 126b can be increased. That is, if polyimide is used for the first layer 130a, when the film thickness of the first layer 130a is increased, the effect of birefringence cannot be ignored so that an image quality degrades. When an organic insulating layer having no birefringence is provided as the second layer 132a without the thickness of the first layer 130a being increased, the first substrate 102 can be provided with a structure that is hardly affected by retardation due to birefringence while the thickness of the first insulating layer 126b is increased as a whole.

In this case, even if the coefficient of thermal expansion of the second layer 132a is higher than that of the first substrate 102, when an organic insulating layer having a relatively small coefficient of thermal expansion is provided as the first layer 130a contacting the first substrate 102, the first insulating layer 126b can be prevented from being peel off from the first substrate 102. When a polyimide layer is provided as the first layer 130a and an acrylic layer is provided as the second layer 132a, the first insulating layer 126b, which is hardly affected by birefringence and is superior in adhesiveness to the first substrate 102, can be provided.

The respective film thicknesses of the first layer 130a and the second layer 132a may be the same as or different from each other. For example, the film thickness of the second layer 132a may be larger than that of the first layer 130a. That is, while the film thickness of the first layer 130a is decreased, an amount of the decrease may be compensated for by increasing the film thickness of the second layer 132a.

An inorganic insulating layer is also applicable instead of the organic insulating layer as the second layer 132a. For example, an inorganic insulating layer composed of silicon oxide, silicon nitride, or the like produced by a sputtering method or a chemical vapor deposition method or an inorganic insulating layer produced by a coating method called spin-on glass (SOG) may be applied as the second layer 132a. Such an inorganic insulating layer can be used in combination with polyimide composing the first layer 130a.

While FIG. 3 illustrates a case where the first insulating layer 126b has a double-layered structure, the present invention is not limited to this. The first insulating layer 126b may have a laminated structure of three or more layers. In this case, the first layer 130a contacting the first substrate 102 is preferably an organic resin layer having a coefficient of thermal expansion relatively closer to that of the first substrate 102 than the other layer and superior in adhesiveness to the other layer.

As illustrated in FIG. 3, the first insulating layer 126b can be used as a reinforcing material for the first substrate 102 while the effect of birefringence is reduced by including a plurality of layers. Thus, the display device 100 can be thinned.

1-2. Modification

Figure 4:
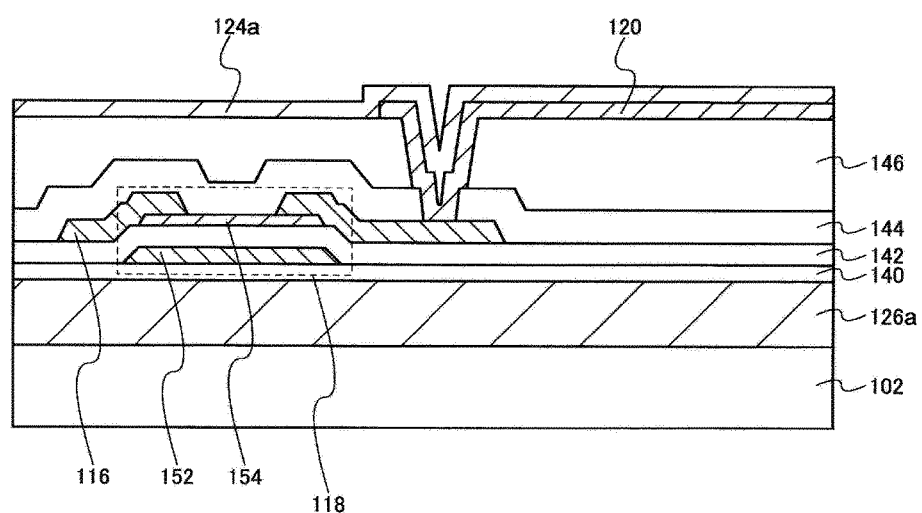
FIG. 4 is a cross-sectional view illustrating a configuration of the display device according to the embodiment of the present invention.

In the present invention, a structure of the pixel electrode is not limited to that illustrated in FIG. 2 as a configuration on the side of the first substrate 102. For example, the first substrate 102 may have a pixel electrode 120b corresponding to a vertical electric field system as a pixel electrode for driving a liquid crystal, as illustrated in FIG. 4. A system for driving the liquid crystal is not limited. Driving systems of various types such as a TN (Twisted Nematic) type, a VA (Vertical Alignment) type, and an MVA (Multi-domain vertical alignment) type are applicable.

The pixel electrode may have an electrode structure of a reflection type in addition to an electrode structure of a transmission type. For example, in a display device of a reflection type, the pixel electrode 120b illustrated in FIG. 4 is provided to have a reflection region provided with a metal electrode composed of aluminum or the like or a structure in which a metal such as aluminum and a transparent conductive film composed of ITO (Indium Tin Oxide), IZO (Indium Zinc Oxide), or the like are laminated. In either case, a structure and an arrangement of the pixel electrode can be changed, as needed, to correspond to the system for driving the liquid crystal.

In the display device illustrated in FIG. 4, a first insulating layer 126a may be replaced with the first insulating layer 126b including a plurality of layers as illustrated in FIG. 3.

1-3. Configuration on the Side of Second Substrate

Figure 5A:
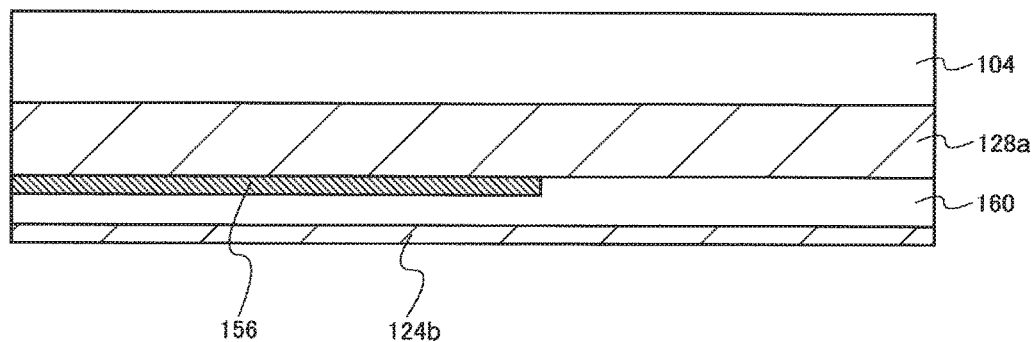
FIG. 5A is a cross-sectional view illustrating a configuration of the display device according to the embodiment of the present invention.

FIG. 5A is a cross-sectional view illustrating a configuration, on the side of a second substrate 104, of the display device according to the present embodiment. The second substrate 104 is a thin plate. If the second substrate 104 has a similar thickness to that of the first substrate 102, a second insulating layer 128a is preferably provided. The second insulating layer 128a has the same configuration as that of the first insulating layer 126a. The second insulating layer 128a is provided in contact with the second substrate 104. The second insulating layer 128a is preferably formed of an organic insulating layer, like the first insulating layer 126a.

The display device 100 further has a light shielding layer 156, an overcoat layer 160, and an orientation film 124b provided on a surface, on the opposite side to the second substrate 104, of the second insulating layer 128a. When the display device is specified to perform color display, a color filter layer may be provided, which is not illustrated in FIG. 5A.

The display device can be obtained by combining the second substrate 104 illustrated in FIG. 5A with the first substrate illustrated in FIGS. 2, 3, and 4. Thus, the display device can be thinned.

Figure 5B:
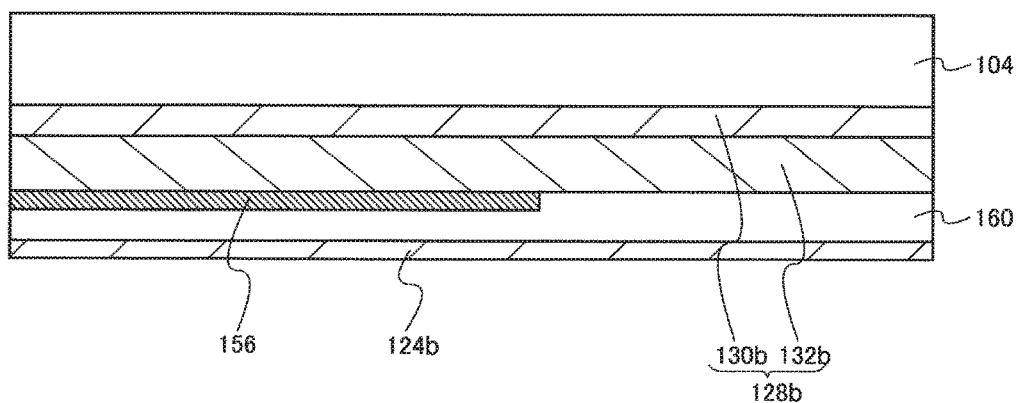
FIG. 5B is a cross-sectional view illustrating a configuration of the display device according to the embodiment of the present invention.

FIG. 5B is a cross-sectional view illustrating a configuration, on the side of the second substrate 104 of the display device according to the present embodiment. As illustrated in FIG. 5B, a second insulating layer 128b includes a plurality of layers, e.g., a first layer 130b and a second layer 132b, as described with reference to FIG. 3. The first layer 130b and the second layer 132b respectively correspond to the first layer 130a and the second layer 132a in the first insulating layer 126a.

The display device 100 can be obtained by combining the second substrate 104 illustrated in FIG. 5B with the first substrate illustrated in FIGS. 2, 3, and 4.

1-4. Thinning of Substrate

The first substrate 102 and the second substrate 104 preferably have the same thickness as that of mother glass having a thickness of not less than 0.5 mm, e.g., approximately 0.7 mm in the manufacturing process. In the manufacturing process, the substrate is handled, like in a normal process. The first substrate 102 and the second substrate 104 are preferably thinned after both the substrates have been stuck to each other. The substrates can be thinned by processing using CMP (Chemical Mechanical Polishing), etching, or the like. In this case, the first substrate 102 is provided with the first insulating layer 126, and the second substrate 104 is provided with the second insulating layer 128. Thus, the insulating layers can be used as a reinforcing material in a polishing process.

As described above, according to the present embodiment, an display device whose mechanical strength has been ensured while substrates are thinned.

Second Embodiment

The present embodiment illustrates an display device that hardly warps while being thinned by controlling respective stresses of a first insulating layer provided in a first substrate and a second insulating layer provided in a second substrate.

2-1. Configuration on the Side of First Substrate

In a first substrate 102 in the configuration illustrated in FIG. 2, the first insulating layer 126a can be used as a so-called "stress adjustment layer" that controls an internal stress exerted on a first substrate 102. When the first substrate 102 is thinned, the first substrate 102 itself can be curved at a predetermined curvature. Respective internal stresses of a third insulating layer 140, a fourth insulating layer 142, a fifth insulating layer 144, a sixth insulating layer 146, and a seventh insulating layer 148 formed on the side of the first surface of the first substrate 102 affect the first substrate 102. If the insulating layers are not peel off from one another at their interfaces, when the sum of the respective internal stresses of the insulating layers exists in a direction in which a tensile stress or a compressive stress is exerted, the first substrate 102 is curved under the effect of the internal stresses.

In the prevent embodiment, the first insulating layer 126a is used as the stress adjustment layer, to suppress the curvature of the first substrate 102. For example, the internal stress is adjusted by adjustment of the heat treatment temperature of an organic insulating layer serving as the first insulating layer 126a and an additive (a filler, etc.) to the organic insulating layer.

The stress adjustment layer, together with the first insulating layer 126a, may be configured by controlling the internal stress of an inorganic insulating layer formed as the third insulating layer 140. When a layer closer to the first substrate 102 is used as the stress adjustment layer, the direct effect of the stress on an element such as a transistor 118 can be alleviated.

The internal stress of the inorganic insulating layer can be controlled depending on a film formation method, a composition, and a film formation condition. As to an internal stress of silicon oxide, aluminum oxide, zirconium oxide, or titanium dioxide produced by a physical vapor deposition method, for example, an example discussed in Japanese Patent Application Laid-Open No. 2009-215624 is referred to. As to control of an internal stress of a silicon oxynitride (SiOxNy) film produced by a plasma CVD (Chemical Vapor Deposition) method, an example discussed in Japanese Patent Application Laid-Open No. 2011-099920 is referred to. As to control of a stress of a silicon nitride film produced by the plasma CVD method, an example discussed in Japanese Patent Application Laid-Open No. 2009-103769 is referred to. A specific example illustrated herein is an example, and an inorganic insulating layer, which is applicable as the third insulating film 140, is not limited to that illustrated above.

Even if the third insulating layer 140 is used as the stress adjustment layer, when an organic resin layer having a coefficient of thermal expansion close to that of the first substrate 102 is used as the first insulating layer 126a, adhesiveness is improved so that each of layers in which the transistor 118 is formed can be prevented from being peel off from the first substrate 102. When the first insulating layer 126a is not only used as a reinforcing material for the first substrate 102 but also used as a part or the whole of the stress adjustment layer, a display device controlled so that an internal stress is alleviated while being thinned can be obtained.

In the configuration on the side of a first substrate 102 illustrated in FIG. 3, the first insulating layer 126b can be used as a stress adjustment layer. In this case, in the first insulating layer 126b, a stress is preferably exerted by a layer spaced apart from the first substrate 102.

In the first insulating layer 126b, a first layer 130a contacting the first substrate 102 can prevent the first insulating layer 126b from being peel off from the first substrate 102 by being provided with an organic insulating layer having a relatively low coefficient of thermal expansion. If the first substrate 102 is a glass substrate, like in the first embodiment, the first layer 130a is preferably an organic insulating layer composed of polyimide.

As a second layer 132a to which a stress is added, an organic insulating material, having a higher coefficient of thermal expansion than polyimide used as the first layer 130a, e.g., acrylic, polyamide (preferably aramid), polyethersulfone, or the like can be used. The second layer 132a adjusts an internal stress by controlling the concentration of a precursor solution containing a precursor and a solvent of an organic material, as described above, a heating condition, and an amount of a filler to be contained therein. The respective film thicknesses of the first layer 130a and the second layer 132a may be the same as or different from each other. For example, the film thickness of the second layer 132a may be larger than that of the first layer 130a.

An inorganic insulating layer composed of silicon oxide, silicon nitride, spin-on glass (SOG), or the like is also applicable instead of the organic insulating layer to the second layer 132a.

Figure 6:
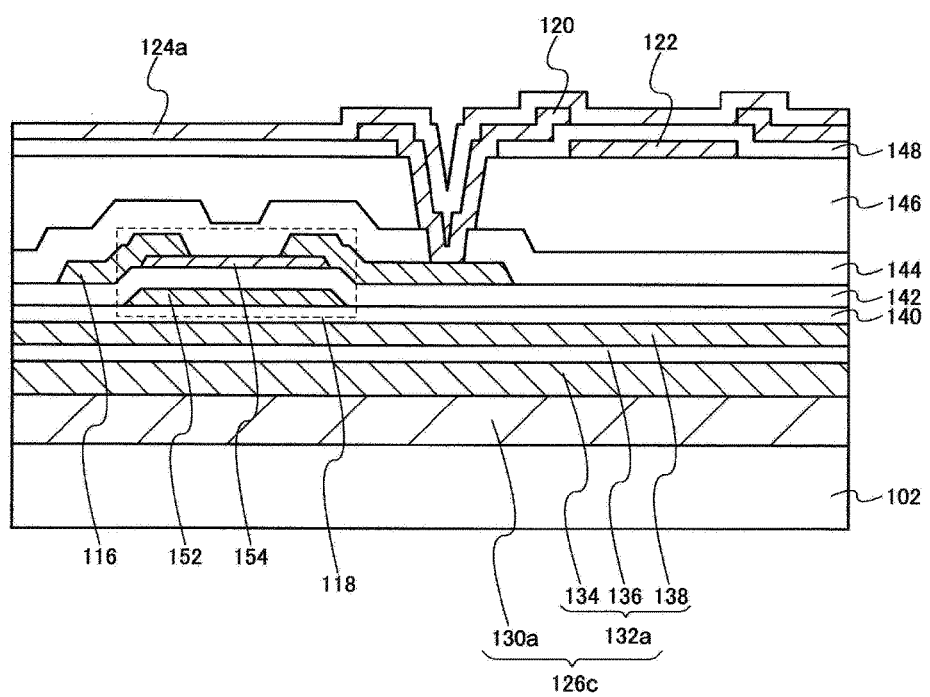
FIG. 6 is a cross-sectional view illustrating a configuration of an display device according to an embodiment of the present invention.

FIG. 6 illustrates a form in which a plurality of inorganic insulating layers is laminated as the second layer 132a. The second layer 132a has a first inorganic layer 134, a second inorganic layer 136, and a third inorganic layer 138 laminated therein. The second inorganic layer 136 has a lower internal stress than the first inorganic layer 134 and the third inorganic layer 138. For example, the first inorganic layer 134 and the third inorganic layer 138 are produced using a silicon nitride film, and the second inorganic layer 136 is produced using a silicon oxide film. The silicon nitride film has a relatively high internal stress. Therefore, the silicon nitride film is appropriate when the second inorganic layer 136 is used as a stress adjustment layer. However, the silicon nitride film is easily peel off under the effect of the internal stress when the film thickness thereof is increased. Therefore, the second inorganic layer 136 produced using the silicon oxide film is provided between the first inorganic layer 134 and the third inorganic layer 138 formed of the silicon nitride film. Such a laminated structure can prevent the second layer 132a from being peel off from the first layer 130a while alleviating the internal stress.

When a stress is added by the second layer 132a on the side above the first layer 130a in a first insulating layer 126c, a display device 100, which hardly warps, can be provided by controlling a residual stress exerted on a first substrate 102 while maintaining adhesiveness of the first insulating layer 126c. In this case, when respective internal stresses of the first layer 130a and the second layer 132a are canceled by each other, the internal stresses can be alleviated. If the first layer 130a has a tensile stress, for example, the second layer 132a preferably has a compressive stress.

2-2. Configuration on the Side of Second Substrate

As illustrated in FIG. 5A, the second insulating layer 128a in the second substrate 104 can be used as a stress adjustment layer, as described in the present embodiment. The second insulating layer 128b in the second substrate 104 illustrated in FIG. 5B can be similarly used as a stress adjustment layer. When a stress adjustment layer for alleviating a residual stress is also provided in the second substrate 104, the second substrate 104 can be prevented from warping.

Figure 7:
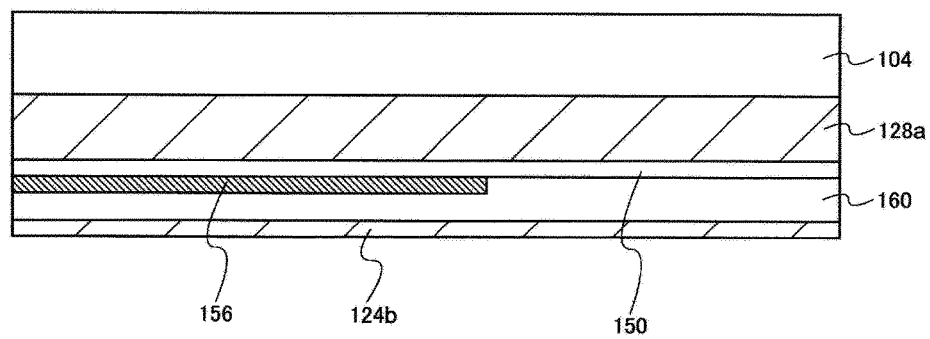
FIG. 7 is a cross-sectional view illustrating a configuration of the display device according to the embodiment of the present invention.

As illustrated in FIG. 7, an eighth insulating layer 150 may be provided on a surface, on the opposite side to a first surface of a second substrate 104, of a second insulating layer 128a and used as a part of a layer for adjusting a stress. The eighth insulating layer 150 is preferably an inorganic insulating layer. Various types of insulating films such as a silicon oxide film, a silicon nitride film, a silicon oxynitride film, and an aluminum oxide film illustrated above are applicable to the eighth insulating layer 150.

As described above, according to the present embodiment, a display device whose mechanical strength is ensured while substrates are thinned, can be obtained. Further, a display device that hardly warps, in which the effect of an internal stress of each of layers respectively provided in a first substrate and a second substrate is alleviated, can be obtained.

Third Embodiment

The present embodiment illustrates a display device having a curved surface shape by controlling respective stresses of a first insulating layer provided in a first substrate and a second insulating layer provided in a second substrate.

3-1. Configuration of Pixel Region

Figure 8:
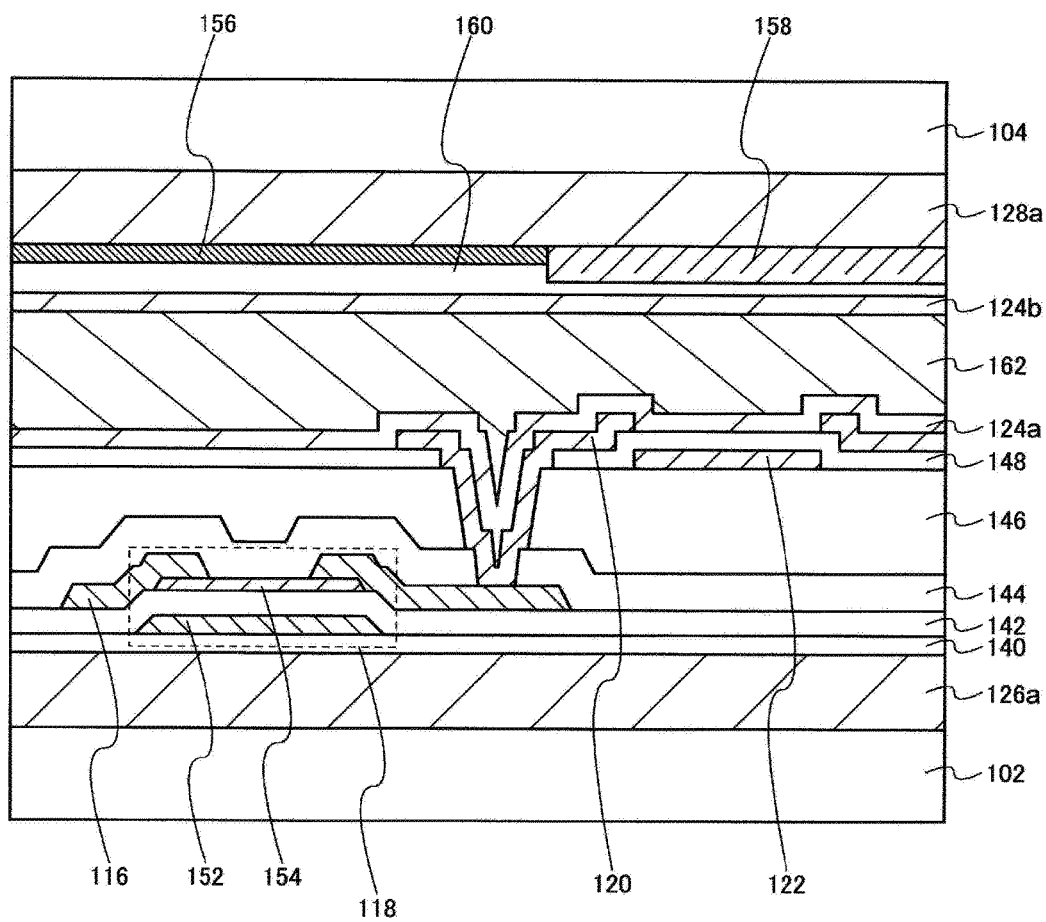
FIG. 8 is a cross-sectional view illustrating a configuration of a display device according to an embodiment of the present invention.

FIG. 8 illustrates a cross-sectional structure of a pixel region 106 where a first substrate 102 and a second substrate 104 are arranged opposite to each other. The first substrate 102 is provided with a first insulating layer 126a, a transistor 118, a pixel electrode 120, and the like. The second substrate 104 is provided with a second insulating layer 128a, a light shielding layer 156, a color filter layer 158, and the like. A liquid crystal layer 162 is provided between the first substrate 102 and the second substrate 104. The first substrate 102 and the second substrate 104 are made to adhere to each other with a seal material in respective outer peripheral portions of both the substrates, which is not illustrated in FIG. 8. Thus, when the first substrate 102 is curved so that its first surface (its surface on which a transistor 118 is provided) becomes a concave surface, a force acts to curve the second substrate 104 so that its second surface (a surface on the opposite side to its surface on which the second insulating layer 128a is provided) becomes a concave surface. In either case, a display device whose display screen is curved by curving the first substrate 102 and the second substrate 104 can be formed.

The present embodiment does not implement the display device whose display screen is curved only by the function of an external force but implements the display device by controlling respective stresses of the first insulating layer 126a and the second insulating layer 128a. If a compressive stress is exerted on the first insulating layer 126a, for example, a tensile stress is exerted on the second insulating layer 128a in the second substrate 104 arranged opposite to the first substrate 102. That is, when opposing stresses are respectively exerted on the first insulating layer 126a and the second insulating layer 128a, and both the stresses are adjusted, a display device in which a pixel region 106 becomes a concave surface or a display device in which a pixel region 106 becomes a convex surface is formed.

In the present specification, the compressive stress means a case where in a substrate provided with an insulating layer serving as a stress adjustment layer, the stress is exerted on the side (the inside) on which a surface, on the side on which the insulating layer is provided, of the substrate is contracted, and the tensile stress means a case where in a substrate provided with an insulating layer serving as a stress adjustment layer, the stress is exerted on the side (the outside) on which a surface, on the side on which the insulating layer is provided, of the substrate is extended.

3-2. External Form

Figure 9:
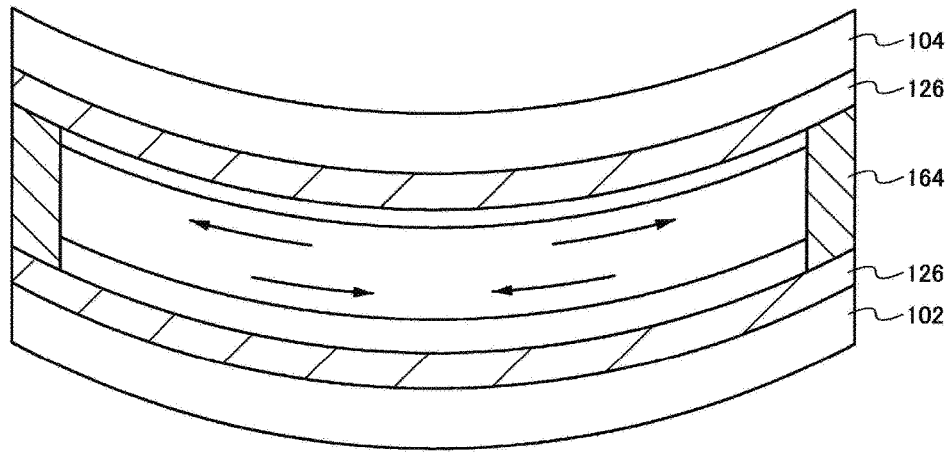
FIG. 9 is a cross-sectional view illustrating a configuration of the display device according to the embodiment of the present invention.
Figure 10:
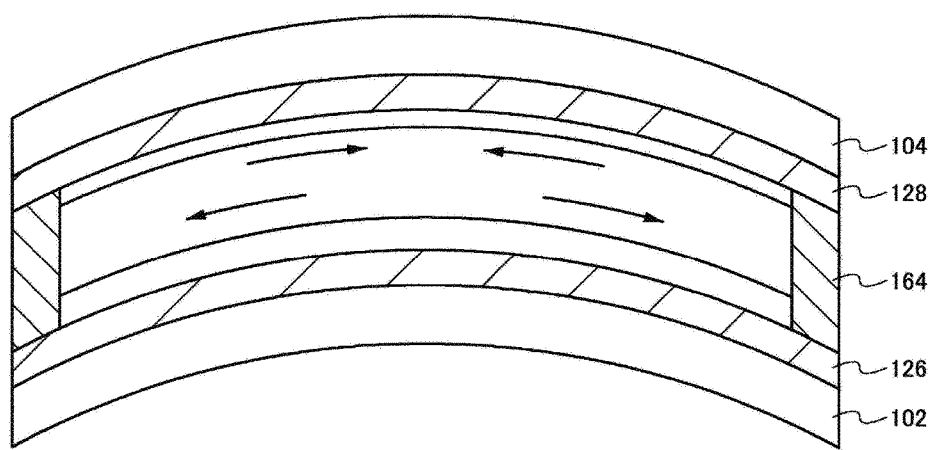
FIG. 10 is a cross-sectional view illustrating a configuration of the display device according to the embodiment of the present invention.

FIG. 9 schematically illustrates a cross-sectional structure of a display device 100 having such a display screen in a curved surface shape. The first substrate 102 is provided with a first insulating layer 126a, and the second substrate 104 is provided with a second insulating layer 128a. The first substrate 102 and the second substrate 104 are made to adhere to each other with a seal material 164. In the display device 100 having the display screen in a curved surface shape, the second substrate 104 is on the side of an observer, and the display screen is viewed. In an example illustrated in FIG. 9, a compressive stress is exerted on the first insulating layer 126a, and a tensile stress is exerted on the second insulating layer 128a. Thus, the display screen becomes a form curved in a concave surface shape, as viewed from a viewer. On the other hand, in FIG. 10, a compressive stress is exerted on a first insulating layer 126a, and a tensile stress is exerted on a second insulating layer 128a. Thus, the display screen becomes a form curved in a convex surface shape, as viewed from the viewer.

Thus, according to the present embodiment, the display device whose display screen is curved even if an external force is not applied thereto by controlling the respective internal stresses of the first insulating layer 126a and the second insulating layer 128a can be provided. The curvature of the display screen enables the display screen to be curved by controlling the respective magnitudes of the internal stresses of the first insulating layer 126a and the second insulating layer 128a. In other words, when a screen of a display panel is curved in a curved surface shape, the effect of a bending stress applied from the outside is alleviated by previously adjusting the stresses of the first insulating layer 126a and the second insulating layer 128a each serving as a stress adjustment layer to match a curved-surface structure so that a strength decrease and film separation can be suppressed.

Each of the configurations illustrated in the first embodiment and the second embodiment are applicable to the forms of the first insulating layer 126a and the second insulating layer 128a in the present embodiment.

Fourth Embodiment

The present embodiment illustrates one form of a transistor appropriate for use in combination with a first insulating layer serving as a stress adjustment layer.

Figure 11:
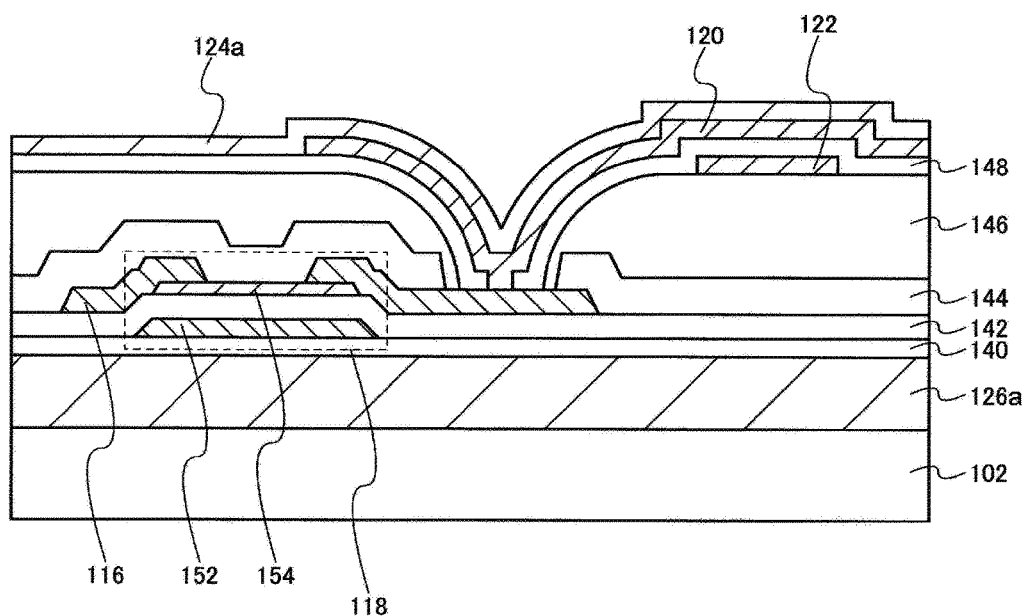
FIG. 11 is a cross-sectional view illustrating a configuration of a display device according to an embodiment of the present invention.

FIG. 11 is a cross-sectional view illustrating a configuration, on the side of a first substrate 102, of a display device according to the present embodiment. The first substrate 102 is provided with a first insulating layer 126a, and a transformer 118 is arranged thereon. The transistor 118 includes a gate electrode 152, a fourth insulating layer 142 serving as a gate insulating layer, and a semiconductor layer 154. As a structure provided on a first surface of the first substrate 102, each of layers forming the transistor 118 is formed after the first insulating layer 126a is formed, as apparent from FIG. 11.

Each of the layers, i.e., the gate electrode 152, the fourth insulating layer 142, and the semiconductor layer 154 is produced by applying a film formation technique such as a sputtering method or a plasma CVD method. Heating processing for heating the first substrate 102 itself is performed in a film formation stage of each of the layers or after film formation. Particularly in a process for producing the semiconductor layer 154 that affects the characteristic of the transistor 118, a temperature for the heating processing affects a semiconductor itself or an interface property with an insulating layer contacting the semiconductor. In heat processing performed for the semiconductor layer 154, the first substrate 102 is also simultaneously heated. Therefore, the first insulating layer 126a already formed is also heated.

Various types of semiconductors such as amorphous silicon, polycrystalline silicon, or an oxide semiconductor are applied as the semiconductor layer 154. Here, a substrate heating temperature during film formation of the amorphous silicon can be not more than 250° C. so that a low-temperature process can be performed. Thus, a thermal effect on the first insulating layer 126a can be reduced. The polycrystalline silicon is crystallized by irradiating the amorphous silicon with a laser beam. Therefore, the first insulating layer 126a may not be thermally affected during polycrystallization. However, hydrogenaration processing performed for the polycrystalline silicon requires a heating temperature of not less than 200° C., and the first insulating layer 126a is simultaneously heated. On the other hand, the oxide semiconductor can be film-formed by a sputtering method, and a heat treatment temperature is also lower than that when the polycrystalline silicon is used. Therefore, the thermal effect on the first insulating layer 126a is reduced.

When the oxide semiconductor is used as the semiconductor layer 154 in the transistor 118, a higher field-effect mobility can be obtained than that when the amorphous silicon is used. A processing temperature (process temperature) during production may be lower than that when the polycrystalline silicon is used. The oxide semiconductor is preferably an oxide containing at least one of gallium (Ga) and tin (Sn) in addition to indium (In) and zinc (Zn).

According to the present embodiment, when the oxide semiconductor is applied to a transistor provided on the side above the first insulating layer, a pixel circuit having a high driving capability can be configured while the thermal effect on the first insulating layer used as the stress adjustment layer is reduced. In other words, when the oxide semiconductor is applied to the transistor, the stress of the first insulating layer can be precisely controlled.

While FIG. 11 illustrates a structure of a bottom gate type in which the semiconductor layer 154 is provided above the gate electrode 152 as the transistor 118, the present invention is not limited to this. A structure of a top gate type in which a gate electrode is provided above a semiconductor layer may be used.

The present embodiment can be implemented by being combined with each of the configurations in the first embodiment, the second embodiment, and the third embodiment, as needed.

What is claimed is:

1. A display device comprising:
    a first substrate;
    a second substrate opposing the first substrate;
    a transistor provided on the first substrate, a scanning signal line, a video signal line, a pixel electrode electrically connected to the transistor, and a first insulating layer; and
    a second insulating layer provided on the second substrate, and a color filter layer and/or a light shielding layer,
    wherein the thickness of the second substrate is 0.3 mm or less,
    the second insulating layer contacts the second substrate, and is provided between the second substrate and the color filter layer or the light shielding layer, and
    the second insulating layer includes a first layer formed of a first material and a second layer formed of a second material that is different from the first material, and
    the second insulating layer is positioned between the second substrate and the light shielding layer.

2. The display device according to claim 1, wherein the first layer contacts the second substrate and the second layer is positioned above the first layer, and
    the first layer is an organic insulating layer, and the second layer is an organic insulating layer or an inorganic insulating layer.

3. The display device according to claim 1, wherein at least one of the first layer and the second layer comprises polyimide.

4. The display device according to claim 1, wherein the second layer is an inorganic insulating layer.

5. The display device according to claim 1, wherein one of the first layer and the second layer has a compressive stress characteristic, and the other layer has a tensile stress characteristic.

6. The display device according to claim 1, wherein the transistor includes an oxide semiconductor.

7. The display device according to claim 1, wherein the pixel electrode includes a reflection region on which external light is reflected.

8. The display device according to claim 1, wherein the organic insulating layer comprises polyimide.

9. The display device according to claim 1, wherein the first layer is an organic insulating layer, and the second layer is an inorganic insulating layer.

* * * * *